(12) United States Patent
Bedi et al.

(10) Patent No.: US 6,288,652 B1
(45) Date of Patent: Sep. 11, 2001

(54) DIGITALLY ENCODED KEYLESS ENTRY KEYPAD SWITCH

(75) Inventors: Sukhminder Bobby Bedi, Dearborn Heights; David Joseph Jaworski, Bloomfield; Mark Christian Aaron, Canton; Michael J. Buchanan, Rochester HIlls; Kenneth George Slotkowski, West Bloomfield, all of MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/227,842

(22) Filed: Jan. 11, 1999

(51) Int. Cl.[7] .................................................. H01H 25/00
(52) U.S. Cl. .............................. 341/22; 341/20; 341/26; 178/17 C; 340/825.59
(58) Field of Search .................................. 341/20, 22, 26; 178/17 C; 340/825.59, 825.79, 825.94; 400/473

(56) References Cited

U.S. PATENT DOCUMENTS

| | | |
|---|---|---|
| 3,792,466 * | 2/1974 | Arnold ................................... 341/25 |
| 4,042,777 * | 8/1977 | Bequaert ................................. 178/79 |
| 4,242,676 | 12/1980 | Piguet et al. . |
| 4,417,247 | 11/1983 | Dressler . |
| 4,502,040 | 2/1985 | Castel . |
| 4,655,621 * | 4/1987 | Holden ................................. 400/100 |
| 4,673,933 | 6/1987 | Bauer . |
| 4,680,572 * | 7/1987 | Meguire ................................. 341/24 |
| 4,906,993 | 3/1990 | Freeman et al. . |
| 5,424,731 | 6/1995 | Kronberg . |

FOREIGN PATENT DOCUMENTS 1492538   11/1977   (GB) .

* cited by examiner

Primary Examiner—Michael Horabik
Assistant Examiner—Albert K. Wong
(74) Attorney, Agent, or Firm—Jennifer M. Stec

(57) ABSTRACT

A five-switch keypad apparatus having four diodes that multiplex the switch contacts onto three sense terminals. The three sense terminals create a binary code that defines eight possible switch states. The eight states are used to indicate each individual switch closure, a lack of a switch closure, and two simultaneous dual switch closures. In an application, a decoder, connected to the three sense terminals, converts the sequence of binary codes into three control signals. The three control signals can control a door lock, a trunk lock and an automatic lock function.

9 Claims, 2 Drawing Sheets

DIGITALLY ENCODED KEYLESS ENTRY KEYPAD SWITCH

TECHNICAL FIELD

This invention relates to the field of keypad apparatus that represents the switch states as a binary number for controlling locking and unlocking functions.

BACKGROUND OF THE INVENTION

The automotive industry is using password entries from five-switch keypads to supplement conventional key-entry and wireless arrangements to allow drivers and passengers to lock and unlock the vehicle doors. Presently, existing keypad apparatuses utilize an individual wire on one side of each normally open switch contact, and a common return wire on the other side. These keypads commonly include an internal lamp for backside illumination of switch legends. The lamp has its own wire for power, and either shares a return wire common to the switches, or has a dedicated return wire. This results in a seven or eight wire interface to the keypad.

Multiplexing the individual switch contact wires reduces the total number of wires of the assembly. The apparatus requires three bits of information to distinguish the five individual switch closure states, and a sixth state where no switch is closed. A keypad apparatus using a common return wire for the three information bits and for a light source requires only a five wire interface. Where the light source has a dedicated return wire, six wires are required. A five or six wire interface keypad apparatus can be made for lower cost than a seven or eight wire interface keypad apparatus.

U.S. Pat. No. 4,502,040, issued to Castel on Feb. 26, 1985, discloses a keypad apparatus that multiplexes four switches onto two wires. In Castel, each switch closure creates an electrically unique connection between the two multiplex wires. The characteristics are of an open circuit, short circuit, forward biased diode, and reverse biased diode, respectively. The keypad apparatus requires successive applications of two reverse electrical voltages to distinguish among the four characteristics. Castel is not well suited for current automotive keypad applications because it can distinguish only four switches, one of the four switches must be closed at all times, and it cannot distinguish simultaneous dual switch closures from single switch closures.

DISCLOSURE OF THE INVENTION

The present invention provides a five-switch keypad apparatus having four diodes that multiplex the switch contacts onto three sense terminals. The three sense terminals create a binary code that defines eight possible switch states. The eight states are used to indicate each individual switch closure, a lack of switch closures, and two simultaneous dual switch closures. In an application, a decoder, connected to the three sense terminals, converts the sequence of binary codes into three control signals. The three control signals can control a door lock, a trunk lock and an automatic lock function.

Accordingly, an object of the present invention is to provide a five-switch keypad apparatus that represents switch states as three bits of information.

This and other objects will become more apparent from a reading of the detailed specification in conjunction with the drawings.

BEST MODE FOR CARRYING OUT THE INVENTION

Figure 1:
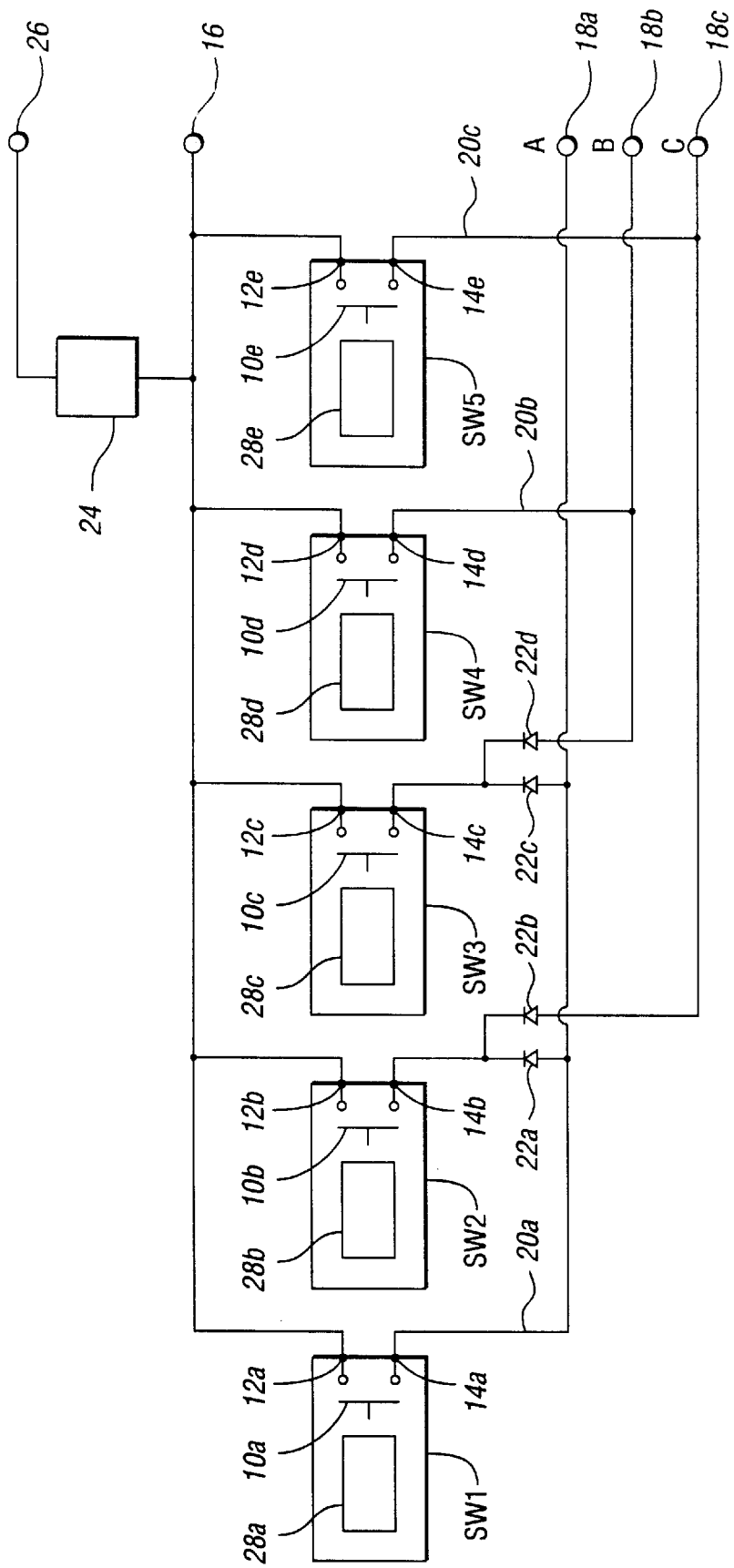
FIG. 1 is a schematic of the preferred embodiment of the present invention where the output is a three-bit value.

FIG. 1 is a schematic of a five-switch keyless entry keypad apparatus. Each switch SW1–SW5 has a normally open contact 10a–10e between a first node 12a–12e and second node 14a–14e. A reference terminal 16 electrically connects all of the first nodes 12a–12e. The second nodes 14a–14e connect to one or more of three sense terminals 18a–18c through wires 20a–20c and diodes 22a–22d. The diodes 22a–22d maintain isolation between the sense terminals 18a–18c when some second nodes, such as second nodes 14b–14c, are connected to more than one sense terminal 18a–18c. A combination of wires 20a–20c and diodes 22a–22d are selected so that as each switch SW1–SW5 is pressed independently, sense terminals 18a–18c produce one of five unique three-bit output codes. When no switches SW1–SW5 are pressed, sense terminals 18a–18c produce a sixth unique output code. When a first predetermined pair of switches SW1–SW5 is pressed simultaneously, sense terminals 18a–18c produce a seventh unique output code. Finally, when a second predetermined pair of switches SW1–SW5 is pressed simultaneously, sense terminals 18a–18c produce an eight unique output code. The diodes 22a–22d and corresponding wires 20a–20c are also arranged in accordance with the present invention so that pressing any pair of switches SW1–SW5, other than the first predetermined pair, will not produce the seventh code.

The present invention orients the four diodes 22a–22d to account for the relative voltage between the reference terminal 16 and sense terminals 18a–18c. In the preferred embodiment, the reference terminal 16 is at ground potential and the sense terminals 18a–18c operate between ground potential and a positive voltage source. Thus, contacts 10a–10e, wires 20a–20c, and diodes 22a–22d pull down the sense terminals 18a–18c when the contacts 10a–10e are in the closed (pressed) position. To support this arrangement, the cathodes of diodes 22a–22d connect to the second nodes 14b–14c of the second and the third switches SW2–SW3. In other arrangements the anodes of diodes 22a–22d connect to the second nodes 14b–14c to pull sense terminals 18a–18c up to the voltage of reference terminal 16.

Table I shows the output codes generated at sense terminals 18a–18c for the embodiment of FIG. 1.

TABLE I

| Switch Pressed | ABC |
|---|---|
| SW1 | 011 |
| SW2 | 010 |
| SW3 | 001 |
| SW4 | 101 |
| SW5 | 110 |
| None | 111 |
| SW4 and SW5 | 100 |
| SW2 and SW4 | 000 |

It is noted that a logical zero is produced when sense terminals 18a–18c are connected to reference terminal 16, and a logical one is produced when sense terminals 18a–18c see an open circuit. Table II shows the output codes for all simultaneous dual switch presses.

TABLE II

| Switch Pressed | ABC |
|---|---|
| SW1 and SW2 | 011 |
| SW1 and SW3 | 010 |
| SW1 and SW4 | 001 |
| SW1 and SW5 | 101 |
| SW2 and SW3 | 000 |
| SW2 and SW4 | 000 |
| SW2 and SW5 | 010 |
| SW3 and SW4 | 001 |
| SW3 and SW5 | 000 |
| SW4 and SW5 | 100 |

In accordance with the present invention, only simultaneous pressing of the fourth switch SW4 and fifth switch SW5 produce the output code "100", making this switch pair unique.

The present invention may include illumination that helps the user find the switches SW1–SW5 in the dark. As shown in FIG. 1, light source 24 may be a single element. The light source 24 may also have multiple elements to improve visibility and reliability. Each light source 24 can be a filament lamp, a light-emitting diode, or any similar source. An illumination terminal 26 provides power for light source 24. The reference terminal 16 provides the return path. Controlling the voltage, current or duty cycle at illumination terminal 26 adjusts the intensity of light source 24. Optionally, light source 24 may have a return path independent from reference terminal 16.

Each switch SW1–SW5 of the preferred embodiment has a legend 28a–28e that light source 24 illuminates. In practical applications, light source 24 illuminates legends 28a–28e from the backside. In a backside illumination arrangement, legends 28a–28e protect light source 24 from the environment. Reading from left to right, legends 28a–28e typically have two characters each, the number's one and two, three and four, five and six, seven and eight, and nine and zero respectively.

Figure 2:
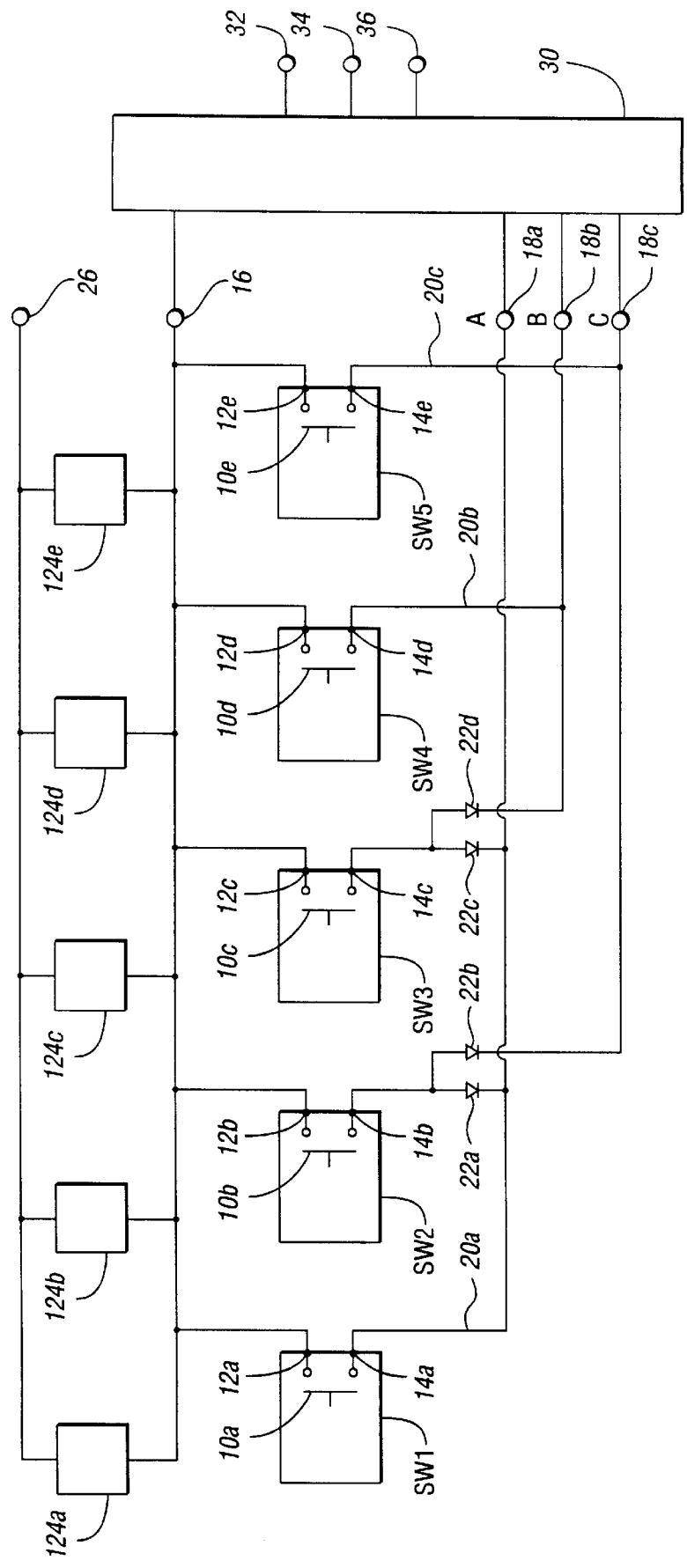
FIG. 2 is a schematic of the present invention in an application where the outputs are control signals for a door lock, trunk lock and an automatic lock feature.

FIG. 2 shows an application of the present invention. A decoder 30 translates the sequences of three-bit output code values at sense terminals 18a–18c into three control signals commonly used in automotive keyless entry applications. The first output is for controlling the door locks. The decoder 30 places door lock output 32 in a locked state when the fourth and fifth switches SW4–SW5 are pressed simultaneously. This dual switch press prevents users from accidently locking themselves out with an errant single switch press or with any other dual switch press. The door lock output 32 is placed in the unlocked state when decoder 30 receives the output codes in a predefined sequence of switch presses and releases. Typically, the predefined sequence is five single switch presses and releases within a set time limit.

The decoder 30 also generates an output signal for controlling a trunk lock. A trunk lock output 34 is set to the locked state when door lock output 32 is set to the locked state. The trunk lock output 34 is set to the unlocked state when the decoder 30 receives a second predefined sequence of switch presses and releases. In the preferred embodiment, the second predefined sequence is the same as the door-unlock sequence plus one additional switch press (e.g., third switch SW3) making it easy for users to remember the sequence.

The decoder 30 provides a third output signal for enabling and disabling an automatic locking function. In the preferred embodiment, decoder 30 requires a multiple step sequence of switch presses, holds, and releases to minimize the possibility of users accidently toggling an auto-lock output 36. For example, the first step of the sequence may be an entry of the predetermined door unlock sequence. Within five seconds of completing the door unlock sequence, the user must then press and hold the fourth switch SW4. Within seconds of pressing the fourth switch SW4 the user must then press and release the second switch SW2. Finally, when the user releases the fourth switch SW4, decoder 30 toggles the auto-lock output 36 between the enabled and disabled states. Decoder 30 may employ other sequences to control auto-lock output 36.

FIG. 2 also shows an alternative orientation for diodes 22a–22d. Here, the anodes of diodes 22a–22d connect to second nodes 14b–14c. This orientation of diodes 22a–22d requires the reference terminal 16 to be above ground potential. Now when a contact 10a–10e is closed, sense terminals 18a–18c pull up to the voltage on reference terminal 16.

FIG. 2 also shows an alternate configuration for light sources 124a–124e. This configuration wires the five light sources 124a–124e in parallel, one for each switch SW1–SW5. The multiple light sources 124a–124e allow for more uniform illumination when all five light sources 124a–124e are working, and limited illumination when some light sources 124a–124e have failed.

While the best modes for carrying out the invention have been described in detail, those familiar with the art to which this invention relates will recognize various alternative designs and embodiments for practicing the invention as defined by the following claims.

What is claimed is:

1. A keypad apparatus comprising:
a first switch, a second switch, a third switch, a fourth switch, and a fifth switch, each switch having a first and a second node, wherein each switch has a pressed position and a released position and the switches are normally in the released position;
a reference terminal; and
three sense terminals defining an output code having eight values, wherein the first node of each switch is connected to the reference terminal and the second node of the each switch is connected to at least one sense terminal, if a second node is connect to more than one sense terminal the connection is through a diode, the second nodes connected such that five output code values are respectively generated in response to pressing each switch individually, a sixth value when all five switches are released, a seventh value when a first predetermined pair of switches are pressed simultaneously, and an eighth value when a second predetermined pair of switches are pressed simultaneously.

2. The keypad apparatus of claim 1 wherein each switch has a legend, and the keypad apparatus further comprises at least one light source emitting a light beam that engages the legends.

3. The keypad apparatus of claim 1 further comprising a decoder electrically connected to the three sense terminals and the reference terminal, the decoder having a door lock output, the door lock output having a locked state and an unlocked state, wherein the door lock output is set to the unlocked state in response to pressing and releasing the five switches in accordance with a first predetermined sequence, and the door lock output is set to the locked state in response to the seventh value.

4. The keypad apparatus of claim 3 wherein the decoder further has an auto-lock output, the auto-lock output having an enable state and a disable state, wherein the auto-lock output is toggled between the enabled state and the disabled state in response to the first predetermined sequence followed by the eight value.

5. The keypad apparatus of claim 3 wherein the decoder further has a trunk lock output, the trunk lock output having a locked state and an unlocked state, wherein the trunk lock output is set to the unlocked state in response to pressing and releasing the five switches in accordance with a second predetermined sequence, and the trunk lock output is set to the locked state in response to the seventh value.

6. A keypad apparatus comprising:

a reference terminal;

a first switch, a second switch, a third switch, a fourth switch, and a fifth switch, wherein each switch has a first node, a second node, and a contact, wherein each contact has a normally open position and a closed position, and wherein each first node is electrically connected to the reference terminal;

a first sense terminal electrically connected to the second node of the first switch;

a second sense terminal electrically connected to the second node of the fourth switch;

a third sense terminal electrically connected to the second node of the fifth switch;

a first diode electrically connecting the second node of the second switch to the first sense terminal;

a second diode electrically connecting the second node of the second switch to the third sense terminal;

a third diode electrically connecting the second node of the third switch to the first sense terminal; and a fourth diode electrically connecting the second node of the third switch to the second sense terminal.

7. The keypad apparatus of claim 6 wherein each of the first diode, the second diode, the third diode and the fourth diode have a cathode, and each cathode is electrically connected to the second node respectively.

8. The keypad apparatus of claim 6 wherein each of the first diode, the second diode, the third diode and the fourth diode have an anode, and each anode is electrically connected to the second node respectively.

9. The keypad apparatus of claim 6 further comprising:

five legends, each legend of the five legends being associated with one switch of the five switches respectively;

at least one light source emitting a light beam that engages the five legends, the light source having a first node and a second node, the first node being electrically connected to the reference terminal; and an illumination terminal electrically connected to the second node of the light source, for powering the at least one light source.

* * * * *